(12) United States Patent
Yoshida et al.

(10) Patent No.: US 6,836,401 B2
(45) Date of Patent: Dec. 28, 2004

(54) CAPACITOR, LAMINATED CAPACITOR, AND CAPACITOR BUILT-IN-BOARD

(75) Inventors: Tsunenori Yoshida, Yawata (JP);
Mikinari Shimada, Yawata (JP);
Hiroyuki Handa, Hirakata (JP);
Masaaki Kuranuki, Kyoto (JP);
Seiichi Nakatani, Hirakata (JP);
Akihiro Ishikawa, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/451,135

(22) PCT Filed: Sep. 19, 2002

(86) PCT No.: PCT/JP02/09598
§ 371 (c)(1),
(2), (4) Date: Jun. 19, 2003

(87) PCT Pub. No.: WO03/028050
PCT Pub. Date: Apr. 3, 2003

(65) Prior Publication Data
US 2004/0047112 A1 Mar. 11, 2004

(30) Foreign Application Priority Data
Sep. 20, 2001 (JP) ......................................... 2001-286830

(51) Int. Cl.[7] ........................... H01G 4/228; H01G 9/10
(52) U.S. Cl. ..................... 361/538; 361/520; 361/306.1
(58) Field of Search ........................... 361/301.4, 306.1, 361/306.3, 307, 308.1, 311, 523–524, 528–529, 534–540, 520, 761–763; 174/260–262

(56) References Cited

U.S. PATENT DOCUMENTS

| 2,290,163 | A | * | 7/1942 | Brennan ..................... 361/520 |
| 3,654,524 | A | | 4/1972 | Puppolo et al. |
| 5,198,967 | A | | 3/1993 | Kuranuki et al. |

FOREIGN PATENT DOCUMENTS

| JP | 4-48616 | 2/1992 |
| JP | 4-123416 | 4/1992 |
| JP | 6-267802 | 9/1994 |
| JP | 7-78730 | 3/1995 |
| JP | 7-27144 | 5/1995 |

* cited by examiner

Primary Examiner—Eric Thomas
(74) Attorney, Agent, or Firm—Merchant & Gould P.C.

(57) ABSTRACT

A capacitor is provided so as to include: a capacitor element including a dielectric layer, and an anode and a cathode that are arranged to support the dielectric layer therebetween; a planar anode terminal; and a planar cathode terminal. The anode terminal and the cathode terminal are led out from the capacitor element in a same direction so as to be in parallel with each other, and at least a part of the anode terminal and at least a part of the cathode terminal overlap each other without contact in a direction perpendicular to a terminal plane of at least one terminal selected from the anode terminal and the cathode terminal. A capacitor built-in board using the capacitor also is provided.

12 Claims, 17 Drawing Sheets

CAPACITOR, LAMINATED CAPACITOR, AND CAPACITOR BUILT-IN-BOARD

TECHNICAL FIELD

The present invention relates to a solid electrolytic capacitor and, more particularly, relates to a capacitor having a small equivalent series inductance for reducing impedance at high frequencies, which is used on the secondary side of a power supply smoothing circuit and on the periphery of a CPU of a computer, and to a capacitor built-in board using the same.

BACKGROUND ART

Recently, with the digitization of electronic equipment, capacitors used for the electronic equipment have been strongly demanded to have larger capacitance and lower impedance at high frequencies. To meet this demand, solid electrolytic capacitors are suitable in terms of large capacitance, and attempts have been made to reduce equivalent series resistance (hereinafter abbreviated as "ESR") and reduce equivalent series inductance (hereinafter abbreviated as "ESL") resulting from the external terminals of the capacitors.

As these solid electrolytic capacitors, JP 4(1992)-123416 A discloses a small-sized and large-capacity solid electrolytic capacitor that employs a dielectric layer obtained by applying anodic oxidation to a surface of aluminum foil, JP 4(1992)-48616 A discloses a small-sized and large-capacity solid electrolytic capacitor in which a dielectric layer, an electrolyte layer and, a conductive layer are generated successively on both surfaces of a sheet-form anode body and a cathode terminal is provided thereon, and JP 6(1994)-267802 A discloses an electrolytic capacitor in which an anode is formed on one surface of a dielectric layer and a cathode is formed on the other surface and two terminals are provided for each of the cathode and the anode, where a pair of one of the two cathode terminals and anode terminals is assigned as input terminals and a pair of the remaining cathode terminal and anode terminal is assigned as output terminals.

Referring to FIGS. 16A and B, a conventional solid electrolytic capacitor used at high frequencies will be described below. FIG. 16A is a perspective view of the conventional capacitor and FIG. 16B is a cross-sectional view of the same capacitor. As shown in FIG. 16A, an anode terminal 32 and a cathode terminal 33 respectively are led out from two opposed surfaces of a package 31. A capacitor element basically is typified by a dielectric layer 34 sandwiched between the anode terminal 32 and the cathode terminal 33 as shown in FIG. 16B, and solid electrolytic capacitors are used for the purpose of small size and large capacity.

In general, such solid electrolytic capacitors are manufactured as follows: an anode oxidation coating is formed on an etched valve metal thin plate to form dielectrics, and a solid electrolyte layer, a carbon layer and a silver conductive resin layer are formed in this stated order on this dielectrics at a portion expect for an anode leading-out portion. Then, the anode terminal 32 and the cathode terminal 33 are connected to this capacitor element, followed by transfer molding, potting and the like so as to form the package 31.

However, the above-described conventional capacitor is disadvantageous in that a distance between the anode terminal and the cathode terminal is increased, thus increasing ESL and impedance at high frequencies.

In addition, in a capacitor built-in board with the conventional capacitor disposed in the board, currents to flow through a land portion of a printed wiring become more likely affected by the skin effect in accordance with increases in frequency, which hinders the currents from flowing effectively inside the capacitor element. As a result, this capacitor built-in board has a drawback of being incapable of making full use of the capacitance of the capacitor and minimizing its inductance.

DISCLOSURE OF THE INVENTION

It is an object of the present invention to provide a capacitor with low ESL, and moreover to provide a capacitor built-in board with high-performance at high frequencies.

To achieve this object, a capacitor of the present invention includes: a capacitor element including a dielectric layer, and an anode and a cathode that are arranged to support the dielectric layer therebetween; a planar anode terminal formed by prolonging the anode or connected with the anode; and a planar cathode terminal formed by prolonging the cathode or connected with the cathode. The anode terminal and the cathode terminal are led out from the capacitor element in a same direction so as to be in parallel with each other, and at least a part of the anode terminal and at least a part of the cathode terminal overlap each other without contact in a direction perpendicular to a terminal plane of at least one terminal selected from the anode terminal and the cathode terminal.

With this configuration, a distance between the anode terminal and the cathode terminal can be shortened, and therefore a capacitor with low ESL at high frequencies can be realized. In the capacitor according to the present invention, the terminals are led out in the same direction and overlap each other at least partially in the direction perpendicular to the terminal plane, and therefore the both terminals are coupled relatively strongly at high frequencies. For that reason, ESL of this capacitor can be reduced more.

The present invention also provides a capacitor built-in board including the above-described capacitor.

This capacitor built-in board includes a first wiring circuit layer, a second wiring circuit layer, a resin layer and the above-described capacitor. The resin layer and the capacitor are arranged between the first wiring circuit layer and the second wiring circuit layer, the anode terminal of the capacitor is connected electrically with a first wiring conductor formed on a main surface of one selected from the first wiring circuit layer and the second wiring circuit layer, and the cathode terminal of the capacitor is connected electrically with a second wiring conductor formed on a main surface of one selected from the first wiring circuit layer and the second wiring circuit layer. With this configuration, a small-sized and high-performance high frequency capacitor built-in board can be realized.

The capacitor built-in board of the present invention may further include a third, a fourth wiring circuit layers and so on and a second, a third resin layers and so on that are interposed between these wiring circuit layers to be configured as a multilayer wiring board, e.g., as a multilayer wiring board in which a wiring circuit layer and a resin layer are laminated alternately.

EMBODIMENTS OF THE INVENTION

Figure 1A:
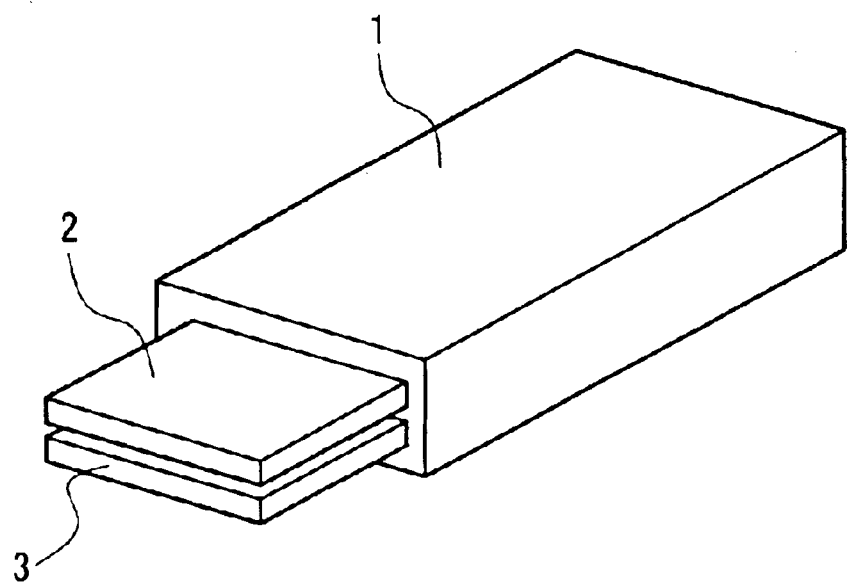
FIG. 1A is a perspective view of a capacitor for illustrating a first example according to Embodiment 1 of the present invention.

In a capacitor according to the present invention, an anode terminal and a cathode terminal extend in a same direction. Both of the terminals may be led out from a same surface of a capacitor element or may be led out from a same surface of a package of the capacitor.

The capacitor according to the present invention may further include an insulation layer arranged between the anode terminal and the cathode terminal. With this configuration, when this capacitor is embedded between wiring circuit layers of a multilayer wiring board, a short between the terminals and the deformation of the terminals can be avoided.

In the present invention, the capacitor further may include a solid electrolyte layer between the dielectric layer and the cathode. Such a solid electrolytic capacitor, more specifically, may include a valve metal thin plate serving as an anode, a dielectric layer formed on a surface of this thin plate, a solid electrolyte layer formed on a surface of this dielectric layer and a cathode arranged so as to be connected electrically with this solid electrolyte layer. With this configuration, a small-sized and large-capacity capacitor having low impedance at high frequencies can be realized.

This solid electrolytic capacitor further may include a carbon layer and a silver conductive resin layer between the solid electrolyte layer and the cathode. Microscopic asperities on the surface of the solid electrolyte layer are filled with the carbon layer, which increases the connection area between the solid electrolyte layer and the cathode, whereby the connection resistance can be reduced.

In the capacitor according to the present invention, preferably, a wiring conductor on a circuit board is used as at least one selected from the anode, the anode terminal, the cathode and the cathode terminal. This is for miniaturizing the capacitor and simplifying the manufacturing process for the same. Preferably, this wiring conductor is formed as the anode and the anode terminal or the cathode and the cathode terminal.

In the capacitor according to the present invention, an end portion of one terminal selected from the anode terminal and the cathode terminal may protrude beyond an end portion of the other terminal in at least one direction selected from a terminal leading-out direction (the same direction in the above description) and an in-plane direction of a terminal plane perpendicular to the terminal leading-out direction (terminal width direction). With this terminal arrangement, when this capacitor is embedded in a multilayer wiring board, both of the terminals can be connected easily with the respective wiring conductors formed on one of the wiring circuit layers, so that the flexibility in the circuit designing can be increased.

In the capacitor according to the present invention, preferably, at least a part of the anode terminal and at least a part of the cathode terminal overlap each other without contact in each of a direction perpendicular to a terminal plane of the anode terminal and a direction perpendicular to a terminal plane of the cathode terminal. More preferably, a terminal plane of the anode terminal and a terminal plane of the cathode terminal are in parallel with each other. This is because both of the terminals can be coupled more strongly at high frequencies.

In the capacitor according to the present invention, a plurality of the above-described capacitors may be laminated so as to form a multilayer capacitor. With this configuration, a small-sized and large-capacity capacitor with low ESL can be realized. In this multilayer capacitor, preferably, anode terminals and cathode terminals of the respective capacitors are led out in a same direction. This is for realizing a much lower ESL. In addition, the multilayer capacitor may be configured so that a plurality of anode terminals and a plurality of cathode terminals are led out in a same direction, and the plurality of anode terminals are connected with one anode external terminal and the plurality of cathode terminals are connected with one cathode external terminal.

The capacitor according to the present invention may include a pair of anode terminals and a pair of cathode terminals. In this case, terminals in each pair extend in mutually opposite directions, and one of the terminals is used as an input side and the other terminal is used as an output side, whereby lower ESL and lower ESR can be realized.

Preferably, letting the above-described anode terminal and cathode terminal be a first anode terminal and a first cathode terminal, respectively, this capacitor further includes a planar second anode terminal formed by prolonging the anode or connected with the anode; and a planar second cathode terminal formed by prolonging the cathode or connected with the cathode. The second anode terminal and the second cathode terminal are led out from the capacitor element in a same direction so as to be in parallel with each other, and at least a part of the second anode terminal and at least a part of the second cathode terminal overlap each other without contact in a direction perpendicular to a terminal plane of at least one terminal selected from the second anode terminal and the second cathode terminal. This configuration allows currents to be likely to flow inside the capacitor element effectively, so that the inductance can be suppressed while making full use of the capacitance of the capacitor. It is preferable to connect the second anode (cathode) terminal with the side of the anode (cathode) opposite of the side to which the first anode (cathode) terminal is connected.

In this capacitor, an insulation layer may be provided also between the second anode terminal and the second cathode terminal.

In this capacitor, a wiring conductor on a circuit board may be used as at least one selected from the anode, the first anode terminal, the second anode terminal, the cathode, the first cathode terminal and the second cathode terminal. This is for miniaturizing the capacitor and simplifying the manufacturing process for the same. Preferably, this wiring conductor is formed as the anode, the first anode terminal and the second anode terminal or the cathode, the first cathode terminal and the second cathode terminal.

In this capacitor, an end portion of one terminal selected from the anode terminal and the cathode terminal may protrude beyond an end portion of the other terminal in at least one direction selected from a terminal leading-out direction (a first terminal leading-out direction) and an in-plane direction of a terminal plane perpendicular to the terminal leading-out direction, and an end portion of one terminal selected from the second anode terminal and the second cathode terminal may protrude beyond an end portion of the other terminal in at least one direction selected from a second terminal's leading-out direction and an in-plane direction of a terminal plane perpendicular to the second terminal's leading-out direction. With this terminal arrangement, in the same way as above, the flexibility in the wiring of the capacitor built-in board can be enhanced.

A plurality of capacitors each provided with a pair of anode terminals and a pair of cathode terminals may be laminated to form a multilayer capacitor. In this case also, the second anode terminals and the second cathode terminals may be led out in the same direction. The multilayer capacitor may have a configuration in which a plurality of second anode terminals and a plurality of second cathode terminals are led out in the same direction, and the plurality of second anode terminals are connected with one second anode external terminal and the plurality of second cathode terminals are connected with one second cathode external terminal.

According to the capacitor built-in board of the present invention, the anode terminal and the cathode terminal are close to each other, thus reducing ESL correspondingly In the capacitor built-in board according to the present invention, the first wiring conductor may be formed on a main surface of the first wiring circuit layer, and the second wiring conductor may be formed on a main surface of the second wiring circuit layer.

In the capacitor built-in board according to the present invention, when a capacitor used has a configuration in which an end portion of one of the anode terminal and the cathode terminal protrudes beyond an end portion of the other terminal in at least one direction selected from a terminal leading-out direction and an in-plane direction of the terminal plane perpendicular to the terminal leading-out direction, the first wiring conductor and the second wiring conductor may be formed on a main surface of a same wiring circuit layer.

The capacitor built-in board according to the present invention may use the above-described capacitor including both of the second anode terminal and the second cathode terminal. In this case, the capacitor may have a configuration in which the second anode terminal and the second cathode terminal are led out from the capacitor element in the same direction so as to be in parallel with each other, and at least a part of the second anode terminal and at least a part of the second cathode terminal overlap each other without contact in a direction perpendicular to a terminal plane of at least one terminal selected from the second anode terminal and the second cathode terminal. Moreover, in this case, preferably, the second anode terminal and the second cathode terminal are connected electrically with a third wiring conductor and a fourth wiring conductor, respectively, the first wiring conductor and the third wiring conductor are formed on a main surface of the first wiring circuit layer, and the second wiring conductor and the fourth wiring conductor are formed on a main surface of the second wiring circuit layer. This configuration allows currents to be likely to flow inside the capacitor element effectively, so that the inductance can be suppressed while making full use of the capacitance of the capacitor.

In order to enhance the flexibility in designing, also in the case where the capacitor having the second anode terminal and the second cathode conductor is used, in the same way as in the first anode terminal and the first cathode terminal, an end portion of one terminal selected from the second anode terminal and the second cathode terminal may protrude beyond an end portion of the other terminal in at least one direction selected from a second terminals' leading-out direction (a second terminal leading-out direction) and an in-plane direction of a terminal plane perpendicular to the second terminal leading-out direction. In this case, the second anode terminal and the second cathode terminal may be connected electrically with a third wiring conductor and a fourth wiring conductor, respectively, and the first wiring conductor, the second wiring conductor, the third wiring conductor and the fourth wiring conductor may be formed on a main surface of the same wiring circuit layer.

In the capacitor built-in board according to the present invention, preferably, at least one selected from the anode, the cathode, the anode terminal and the cathode terminal constitutes at least a part of a wiring conductor formed on a main surface of one selected from the first wiring circuit layer and the second wiring circuit layer. With this configuration, the capacitor built-in board can be miniaturized and the manufacturing process for the same can be simplified. For instance, at least one selected from the anode and the anode terminal may constitute at least a part of a wiring conductor formed on a main surface the first wiring circuit layer, and at least one selected from the cathode and the cathode terminal may constitute at least a part of a wiring conductor formed on a main surface the second wiring circuit layer. Alternatively, for instance, the anode and the cathode may constitute a part of wiring conductors formed on main surfaces, e.g., inner main surfaces, of the first wiring circuit layer and the second wiring circuit layer, respectively.

The following describes embodiments of the present invention, with reference to the drawings.

Embodiment 1

Figure 1B:
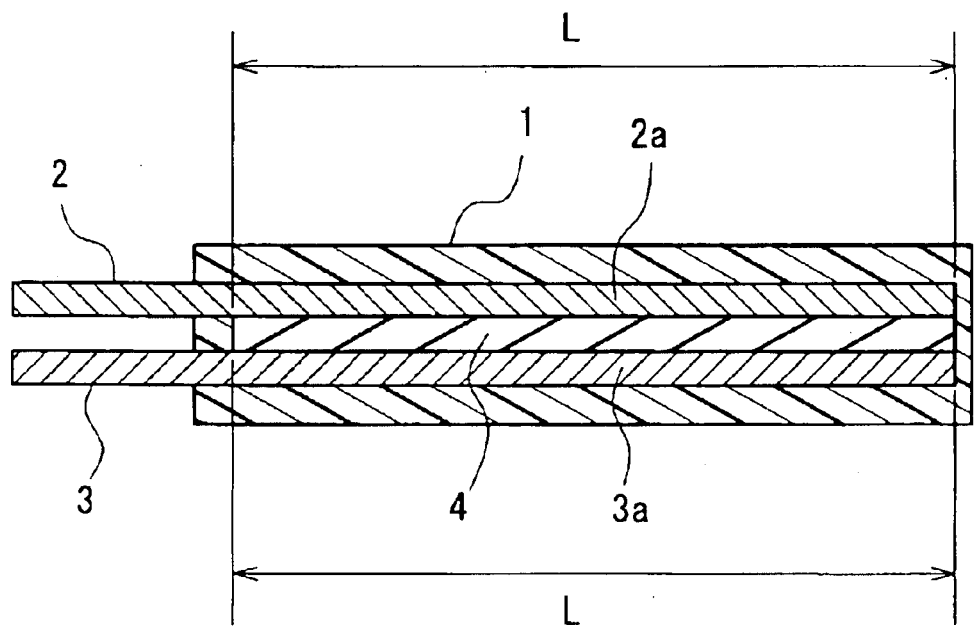
FIG. 1B is a cross-sectional view of the same capacitor.

FIG. 1A is a perspective view of a capacitor for illustrating a first example according to Embodiment 1, and FIG. 1B is a cross-sectional view of the same capacitor. In this capacitor, a planar anode terminal 2 and a planar cathode terminal 3 are led out in the same direction from a capacitor element so as to protrude in the same direction from the same surface of a substantially parallelepiped package 1. The terminals 2 and 3 do not contact with each other in the direction perpendicular to their terminal planes, and overlap each other at least partially (totally in this example). In addition, their terminal planes are in parallel with each other.

In this capacitor, the capacitor element includes an anode 2a, a dielectric layer 4 and a cathode 3a. The anode 2a and the cathode 3a are portions contacting with the dielectric layer 4, which have a length L. Between the anode and the cathode of the capacitor element, another layer (e.g., a solid electrolyte layer) further may be interposed. Although the anode terminal 2 and the cathode terminal 3 in this capacitor are formed by prolonging the anode 2a and the cathode 3a, respectively, the anode 2a and the cathode 3a may be provided with an anode terminal 2 and a cathode terminal 3 formed by connecting terminals that are prepared separately from the anode 2a and the cathode 3a with these electrodes.

Figure 2A:
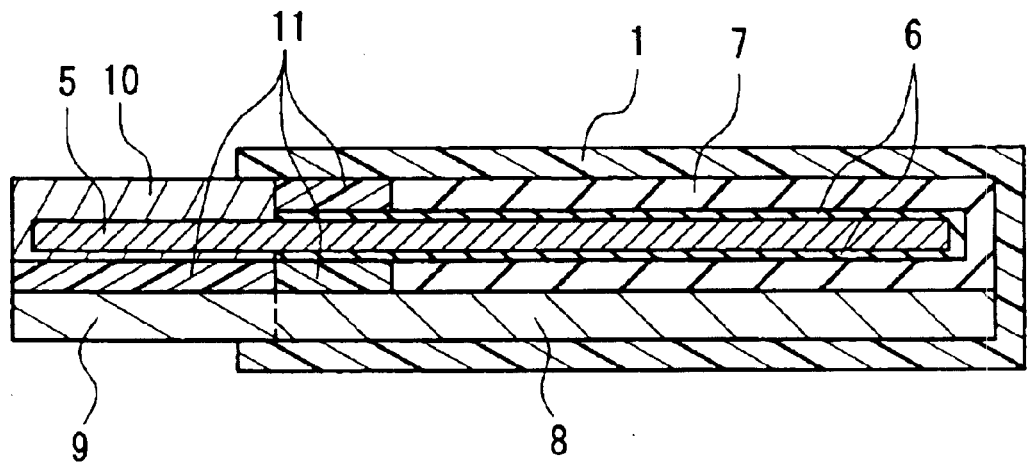
FIG. 2A is a cross-sectional view of a capacitor for illustrating a second example according to Embodiment 1 of the present invention.
Figure 2B:
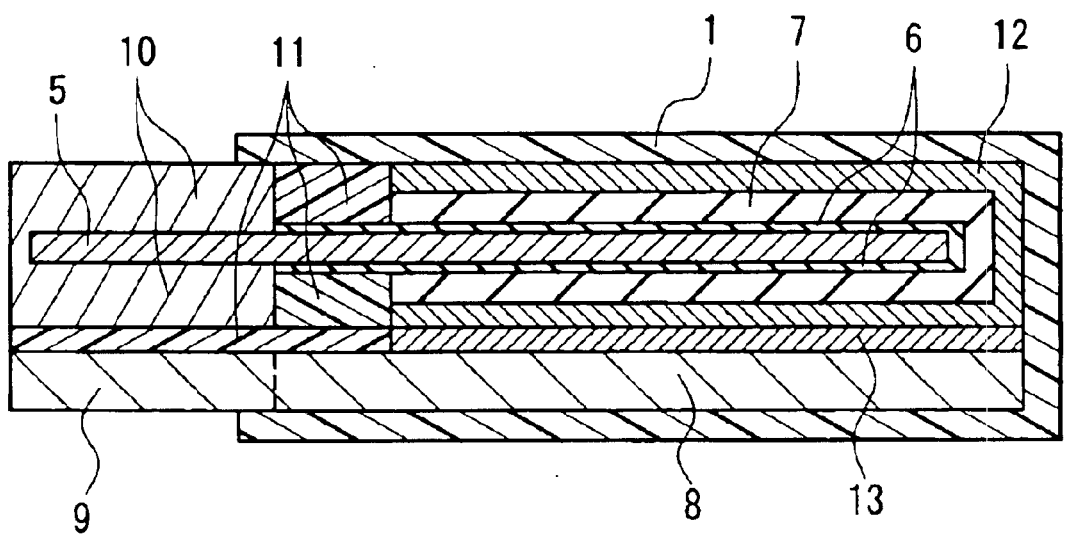
FIG. 2B is a cross-sectional view of a capacitor for illustrating a third example according to Embodiment 1 of the present invention.

FIGS. 2A and 2B are cross-sectional views showing solid electrolytic capacitors as second and third examples according to Embodiment 1 of the present invention. In the solid electrolytic capacitor shown in FIG. 2A, an anode oxidation film layer (dielectric layer) 6 is formed on a surface of a valve metal thin plate 5 except for a region on which an anode terminal (anode external terminal) 10 is to be formed. On a surface of the anode oxidation film layer 6, a solid electrolyte layer 7 made up of a first solid electrolyte layer made of manganese oxide and a second solid electrolyte layer made of polypyrrole is formed, and a cathode 8 is connected with the solid electrolyte layer 7. Note here that the solid electrolyte layer 7 and the cathode 8 may be bonded with a conductive adhesive.

At an end portion of the valve metal thin plate 5, the anode terminal 10 made of nickel plate is attached, and a portion of the cathode 8 that does not contact with the solid electrolyte layer 7 is used as a cathode terminal 9. The anode terminal 10 and the cathode terminal 9 are led out in the same direction from the capacitor element. The anode terminal 10 and the solid electrolyte layer 7 are isolated from each other by an insulation layer (resin layer) 11, and the anode terminal 10 and the cathode terminal 9 also are isolated from each other by an insulation layer 11. This capacitor is protected by a resin package 1 so that the anode terminal 10 and the cathode terminal 9 are exposed at least partially.

In the solid electrolytic capacitor shown in FIG. 2B, a cathode conductive layer 12 is disposed on a solid electrolyte layer 7 by forming a carbon layer and a silver conductive resin layer in this order, a cathode 8 made of silver foil is bonded thereon with a conductive adhesive 13. In this example also, a leading end of the cathode 8 is used as a cathode terminal 9, and a nickel plate serving as an anode terminal (anode external terminal) 10 is attached to an end portion of a valve metal thin plate 5. The anode terminal 10 and the cathode terminal 9 are isolated from each other by an insulation layer 11. In this case also, the entire capacitor is protected by a resin package 1 expect for at least a part of the anode terminal 10 and the cathode terminal 9.

The solid electrolytic capacitor shown in FIG. 2B is manufactured, for example, as follows: sheet or foil having a capability of forming an anode oxidation coating, made of Al, Ta, Ti, Nb and the like, can be used as the valve metal thin plate 5, and an example using Al foil will be described below.

Al foil cut into a strip of 3 mm in width was etched electrochemically in an aqueous solution such as hydrochloric acid so as to form Al etched foil serving as the valve metal thin plate 5, and anodic oxidation was conducted on a predetermined portion of this valve metal thin plate 5 in an aqueous solution containing an electrolyte such as ammonium adipate under a condition of 5 V for one hour, so that an anodic oxidation film layer 6 serving as dielectric was formed. A 1.7 mol/liter of decreased level aqueous solution containing manganese nitrate was applied on a predetermined portion of this anodic oxidation film layer 6, followed by thermal decomposition at 300° C. for 20 minutes in an atmosphere of steam at 50 volume % so as to form a manganese oxide layer.

Next, an electroconductive polymer layer made of polypyrrole serving as the solid electrolyte was formed over the entire manganese oxide layer by electrolytic polymerization. The electrolytic polymerization was conducted in an aqueous solution containing 0.25 mol/liter of pyrrole and 0.1 mol/liter of alkylnaphthalene sodium sulfonate at 2 mA/cm² of constant current (a current per an apparent unit area of the Al etched foil), where a stainless steel electrode provided close to the manganese oxide layer functioned as an anode for the electrolytic polymerization. The manganese oxide layer and the electroconductive polymer layer made of polypyrrole are joined to be the solid electrolyte layer 7. Further, a graphite layer and a silver paint layer were formed successively as the cathode conductive layer 12 on this electroconductive polymer layer, so that an element of 4 mm in length, 3 mm in width and with the rating of 2 V–25 µF was made.

Subsequently, a nickel plate serving as the anode terminal 10 was bonded by resistance welding, and then a polyimide tape as the insulation layer 11 was attached to a portion of the valve metal thin plate 5 on which the anode oxidation film layer 6 had not been formed. Further, a nickel plate serving as the cathode 8 and the cathode terminal 9 was bonded with a silver conductive adhesive. Also, a portion between the anode terminal 5 and the cathode terminal 9 was filled with a polyimide resin as the insulation layer 11. Finally, an epoxy resin was molded as the package 1 by transfer molding.

Figure 3:
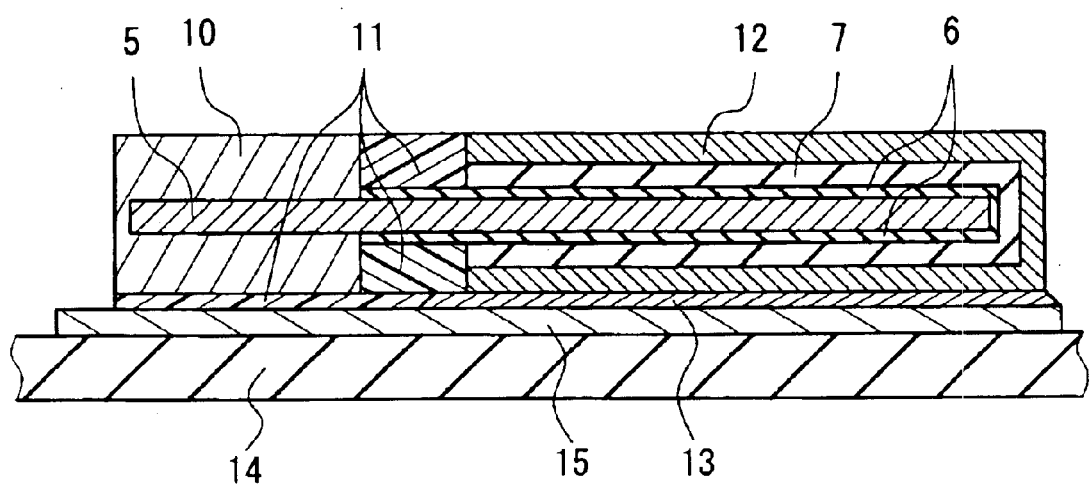
FIG. 3 is a cross-sectional view of a capacitor for illustrating a fourth example according to Embodiment 1 of the present invention.

FIG. 3 is a cross-sectional view of a solid electrolytic capacitor as a fourth example according to Embodiment 1. This capacitor has the same configuration as that of the capacitor of FIG. 2 except that a wiring conductor 15 formed on a main surface of a circuit board 14 is used as a cathode and a cathode terminal and a package 1 is omitted. A cathode conductive layer 12 and the wiring conductor 15 are bonded using a conductive adhesive 13. This capacitor is advantageous in that the capacitor has a simple configuration.

Embodiment 2

Figure 4A:
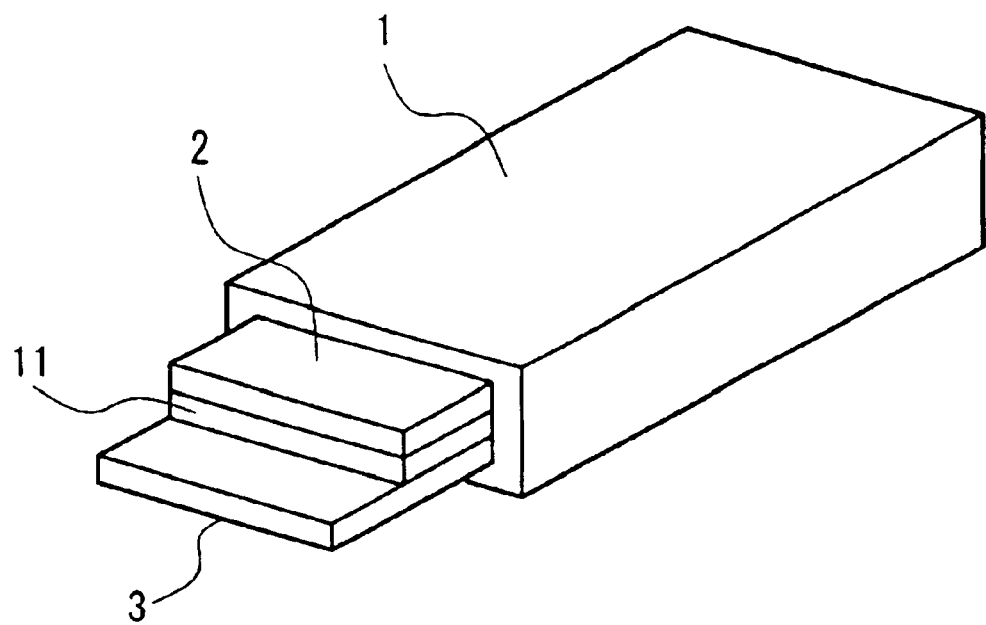
FIG. 4A is a perspective view of a capacitor for illustrating a first example according to Embodiment 2 of the present invention.
Figure 4B:
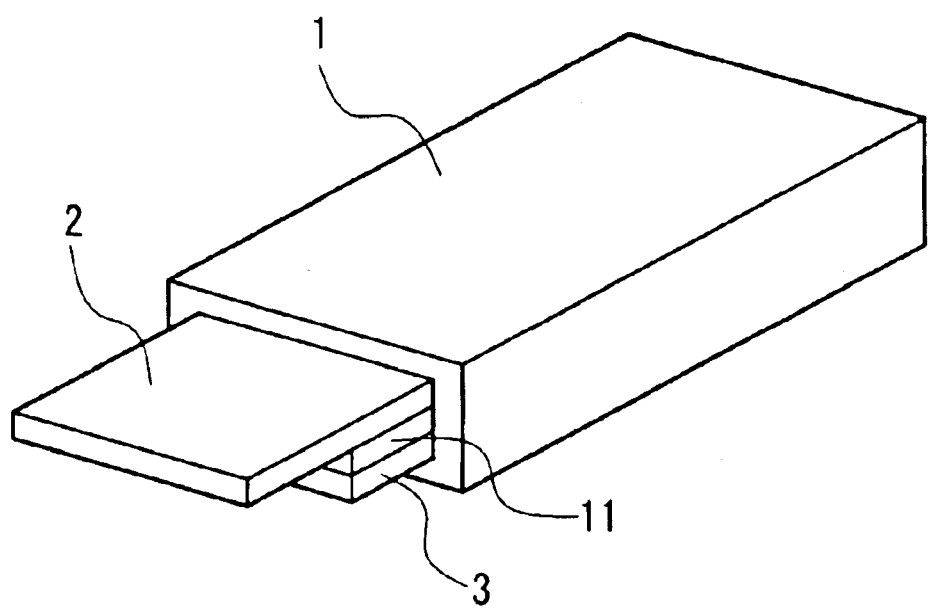
FIG. 4B is a perspective view of a capacitor for illustrating a second example according to Embodiment 2 of the present invention.

FIGS. 4A and B are perspective views of capacitors for illustrating first and second examples according to Embodiment 2 of the present invention. In the capacitor shown in FIG. 4A, a planar anode terminal 2 and a planar cathode terminal 3 are led out from one end surface of a package 1 so that the terminals are in parallel with each other and the cathode terminal 3 protrudes farther than the anode terminal 2. Whereas, in the capacitor shown in FIG. 4B, an anode terminal 2 protrudes farther than a cathode terminal 3. In these capacitors, an insulation layer 11 is formed only at a region where both of the terminals overlap each other. In either case, when they are embedded in a multilayer wiring board, their anode terminals 2 and cathode terminals 3 can be connected easily with the same wiring circuit layer in the multilayer wiring board. These terminals can be connected easily with different wiring circuit layers also, so that the flexibility in the circuit designing can be increased.

Figure 5A:
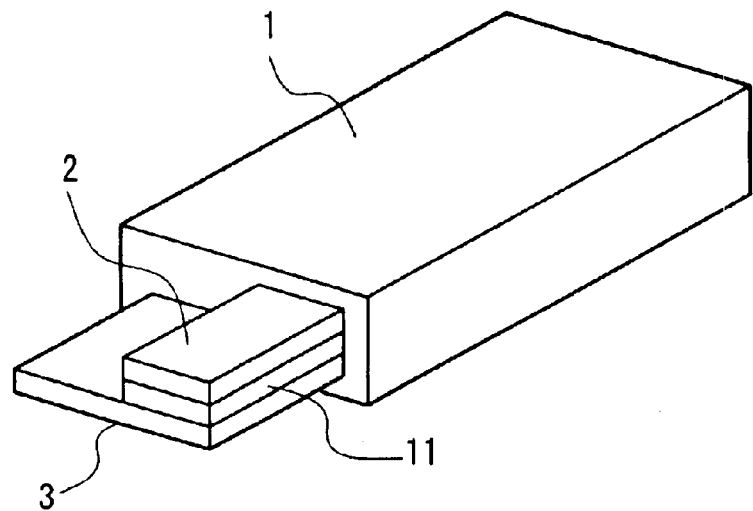
FIG. 5A is a perspective view of a capacitor for illustrating a third example according to Embodiment 2 of the present invention.
Figure 5B:
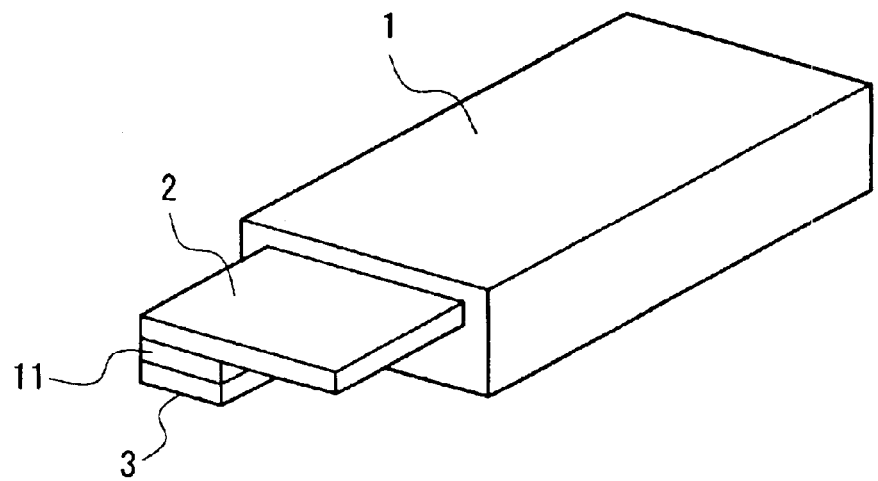
FIG. 5B is a perspective view of a capacitor for illustrating a fourth example according to Embodiment 2 of the present invention.
Figure 5C:
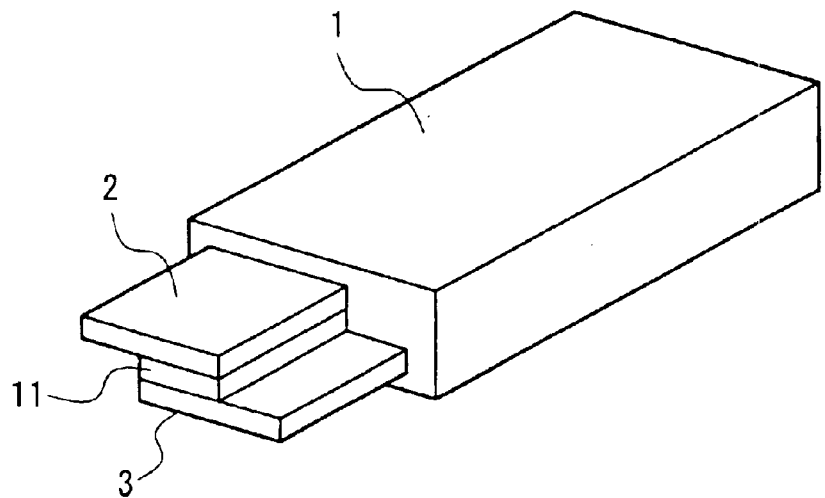
FIG. 5C is a perspective view of a capacitor for illustrating a fifth example according to Embodiment 2 of the present invention.

FIGS. 5A, B and C are perspective views of capacitors for illustrating third, fourth and fifth examples according to Embodiment 2. In all cases, an anode terminal 2 and a cathode terminal 3 have an overlap portion where they overlap without contacting with each other and a not-overlap portion in the in-plane direction of the terminals, which is perpendicular to the leading-out direction (terminal width direction). That is, FIG. 5A shows an example where the width of the cathode terminal 3 is larger than that of the anode terminal 2 so that the cathode terminal 3 protrudes beyond the anode terminal 2 in the terminal width direction, FIG. 5B shows the reverse example of FIG. 5A and FIG. 5C shows an example where a portion of the anode terminal 2 and a portion of the cathode terminal 3 overlap each other at a central portion of a package and the anode terminal 2 protrudes from one end portion of the overlap portion in the terminal width direction whereas the cathode terminal 3 protrudes from the other end portion.

When viewing the capacitors shown in FIGS. 5A and B from one side in the direction perpendicular to the terminal planes (i.e., viewed from above or below), both of the anode terminal 2 and the cathode terminal 3 are visible. That is to say, when these capacitors are embedded in a multilayer wiring board formed by laminating a resin layer and a wiring circuit layer, the anode terminal 2 and the cathode terminal 3 can be connected with different wiring conductors in the same wiring circuit layer. In the case of the capacitor shown in FIG. 5C, both terminals are visible from both sides in the direction perpendicular to the terminal planes. When this capacitor is embedded in a multilayer circuit board, both terminals can be connected with wiring conductors in arbitral wiring circuit layers.

According to these capacitors, the anode terminal 2 and the cathode terminal 3 are close to each other and are arranged to have a partially overlapped portion, so that lower ESL can be realized and the anode terminal and the cathode terminal can be connected with wiring conductors in the same wiring circuit layer. Also, an electrode terminal configuration in which the configurations of FIGS. 4A, B and FIGS. 5A, B and C are combined is possible.

Figure 6:
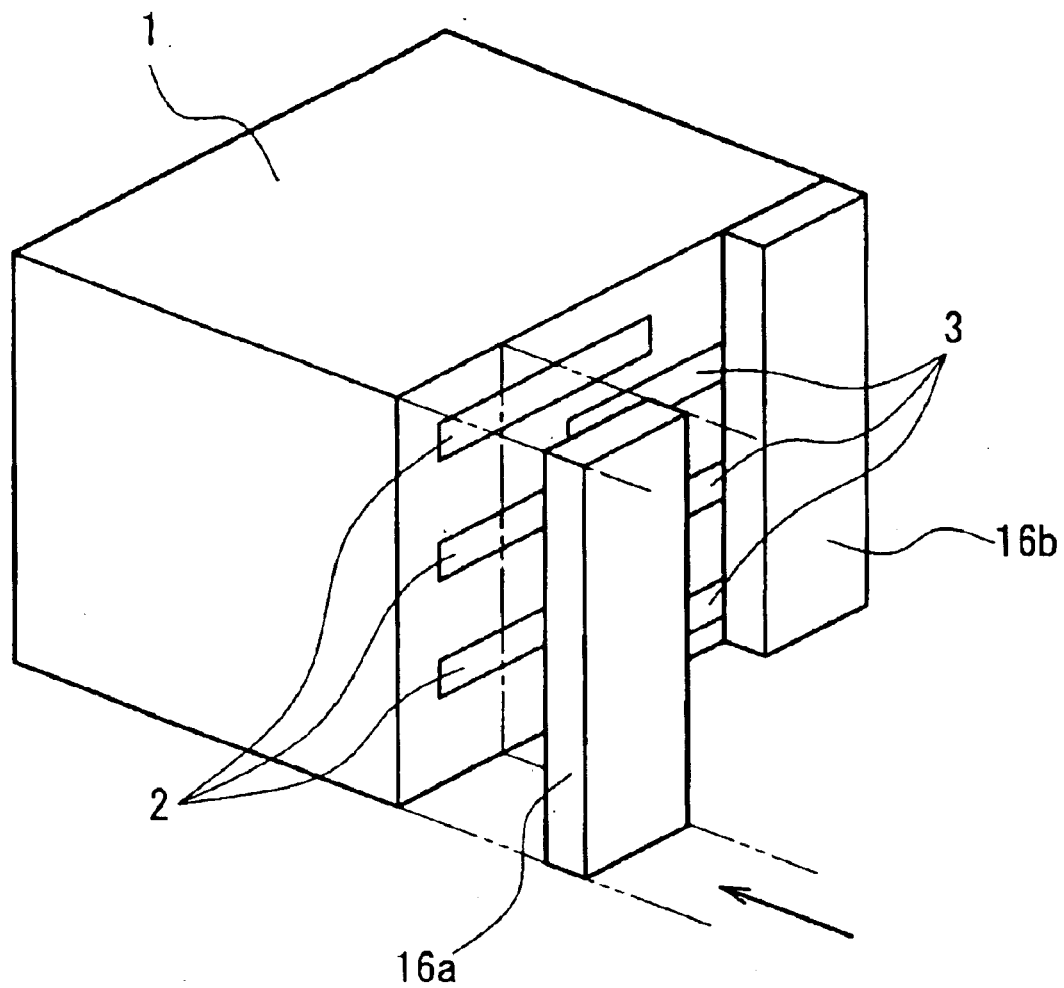
FIG. 6 is a perspective view of a multilayer capacitor according to Embodiment 2 of the present invention.

By laminating a plurality of the capacitors described in Embodiment 1 and Embodiment 2 to form a multilayer capacitor, a capacitor with much larger capacity can be realized. FIG. 6 is a perspective view of a multilayer capacitor configured by laminating a plurality of capacitor elements. For the sake of clarity, FIG. 6 shows a virtual state where an anode external terminal 16a is displaced.

In this multilayer capacitor, a plurality of capacitor elements are laminated, and anode terminals 2 and cathode terminals 3 led out in the same direction from the respective capacitor elements are connected with an anode external terminal 16a and a cathode external terminal 16b, respectively. This multilayer capacitor corresponds to a mode in which three capacitors shown in FIG. 5C are laminated. As a package, a resin or a resin case may be used. The anode external terminal 16a and the cathode external terminal 16b may be formed on one surface of the package by a method of plating, baking a conductive resin paste, attaching a metal plate or the like.

Embodiment 3

Figure 7A:
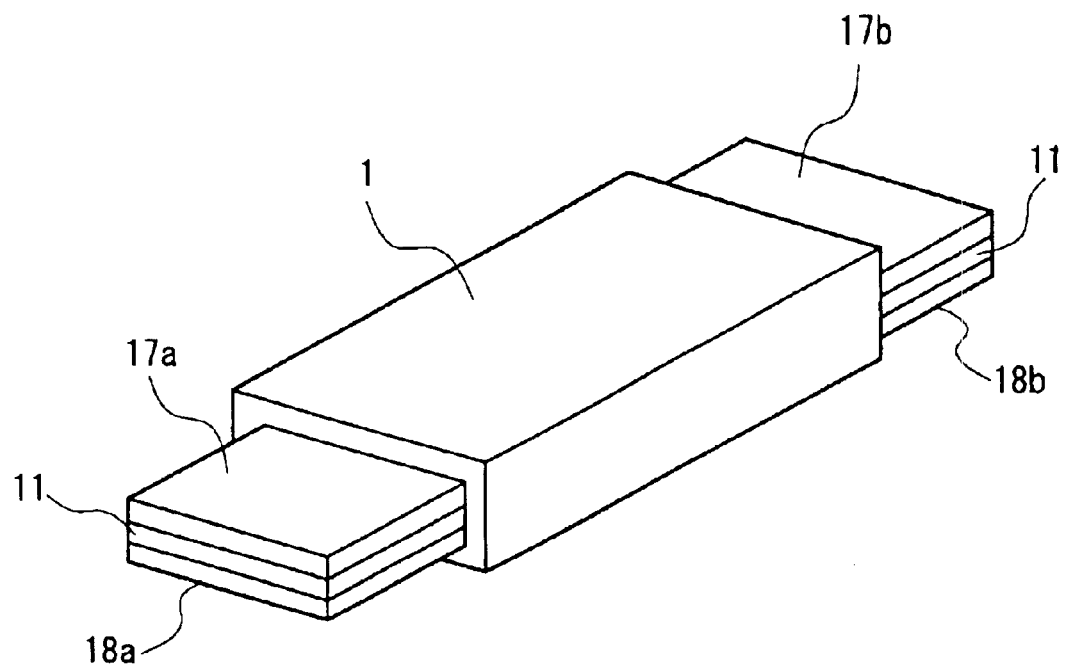
FIG. 7A is a perspective view of a capacitor for illustrating a first example according to Embodiment 3 of the present invention.
Figure 7B:
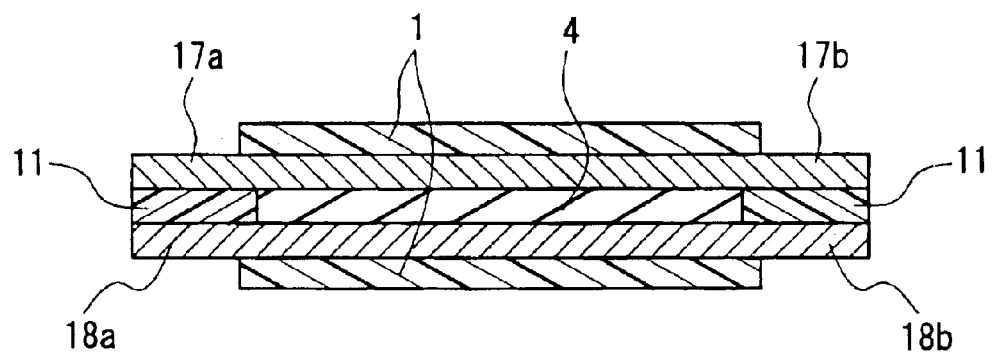
FIG. 7B is a cross-sectional view of the same capacitor.

FIG. 7A is a perspective view of a capacitor for illustrating a first example according to Embodiment 3, and FIG. 7B is a cross-sectional view of the same capacitor. As shown in these drawings, in this capacitor, a first anode terminal 17a and a first cathode terminal 18a are led out from a capacitor element in a first direction, and a second anode terminal 17b and a second cathode terminal 17b are led out from the capacitor element in a second direction. Preferably, the first direction and the second direction are in mutually opposite directions, i.e., an angle between the two directions is 180°. All of these terminals are in a planar form, and they extend so that their terminal planes are in parallel between the anode and the cathode.

Thus, in this capacitor, a set of the first anode terminal 17a and the first cathode terminal 18a and a set of the second anode terminal 17b and the second cathode terminal 18b are led out from opposed side surfaces of a package 1 in the mutually opposite directions. When this capacitor is embedded in a multilayer wiring board in which a wiring circuit layer and a resin layer are laminated, a wiring conductor on a circuit board may be used as the first anode terminal/the anode/the second anode terminal and/or the first cathode terminal/the cathode/the second cathode terminal, which further can make the wiring board slimmer.

Figure 8A:
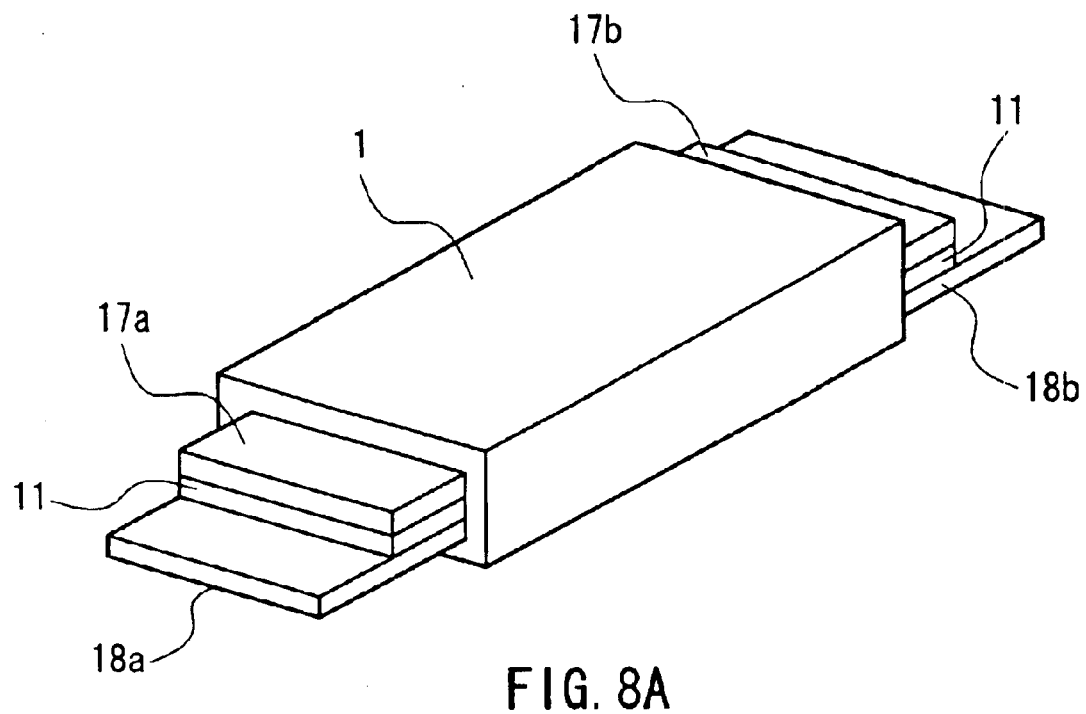
FIG. 8A is a perspective view of a capacitor for illustrating a second example according to Embodiment 3 of the present invention.
Figure 8B:
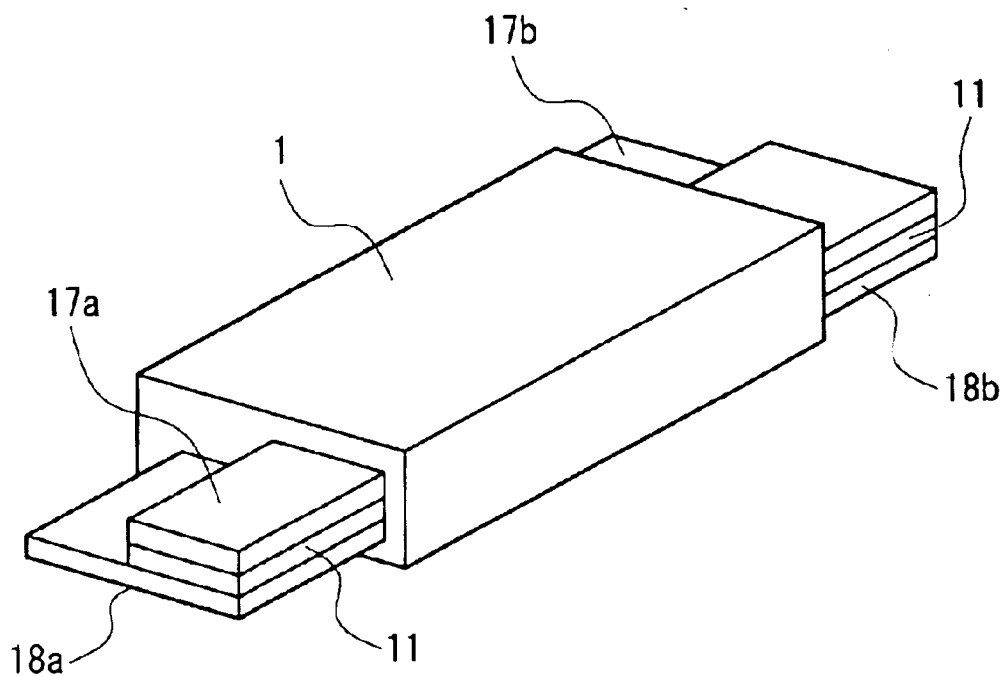
FIG. 8B is a perspective view of a capacitor for illustrating a third example according to Embodiment 3 of the present invention.

FIGS. 8A and B are perspective views of capacitors for illustrating second and third examples according to Embodiment 3. As shown in FIG. 8A, a first anode terminal 17a is made shorter than a first cathode terminal 18a and a second anode terminal 17b is made shorter than a second cathode terminal 18b, whereby the flexibility in the combination of connecting the respective electrode terminals and wiring conductors in wiring circuit layers can be increased. Also, as shown in FIG. 8B, by varying dimensions in the width direction between the first anode terminal 17a and the first cathode terminal 17b, the same effects as those described in the example of FIG. 8A can be obtained. The reverse relationships of those in FIGS. 8A and 8B between the anode terminals and the cathode terminals or a combination of the relationships of FIGS. 8A and 8B also have the same effects as above.

A plurality of capacitor elements, each having a pair of anode terminal and cathode terminal led out from each of the two opposed side surfaces, may be laminated to form a multilayer capacitor as shown in FIG. 6, where a pair of external terminals are arranged on both side surfaces of the multilayer capacitor.

Figure 9A:
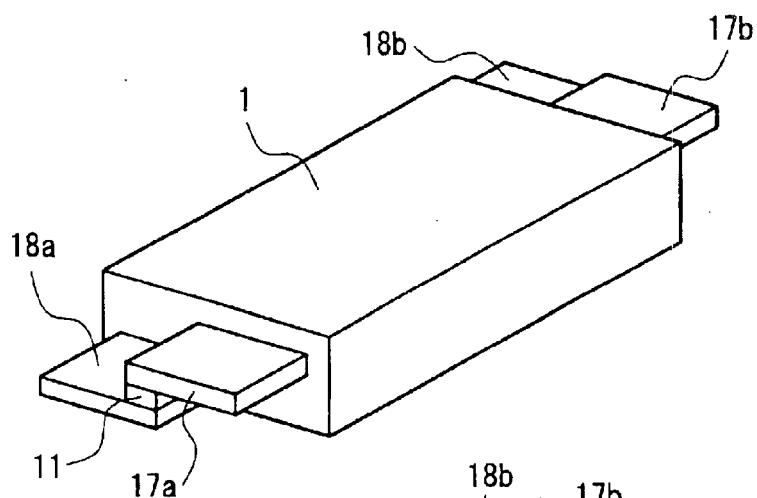
FIG. 9A is a perspective view of a capacitor for illustrating a fourth example according to Embodiment 3 of the present invention.

FIGS. 9A and B show a fourth example according to Embodiment 3. As shown in FIG. 9A, a set of a first anode terminal 17a and a first cathode terminal 18a is led out from a first side surface of a package 1, and a set of a second anode terminal 17b and a second cathode terminal 18b is led out from a second side surface opposed to the first side surface. In the fourth example, the anode terminal and the cathode terminal in each set overlap each other partially in the in-plane direction of the terminals, which is perpendicular to the terminal leading-out direction. An insulation layer 11 is disposed at this overlap portion only.

Figure 9B:
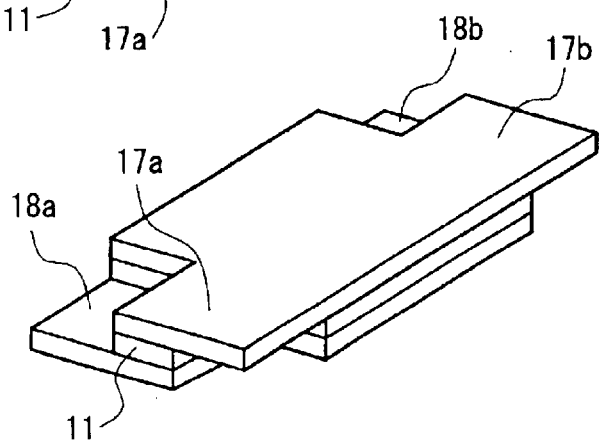
FIG. 9B is a perspective view for illustrating the shapes and the arrangement of an anode terminal and a cathode terminal of the same capacitor.

As shown in FIG. 9B, when the package 1 is removed, the anode and the anode terminals form a letter T as a whole, and the cathode and the cathode terminals also form a letter T. These letter form electrodes are combined so that their central vertical portions in the T letter form extend in mutually opposite directions.

When a circuit is configured with such a capacitor, low ESL can be realized by designing so as to allow currents to flow from the first anode terminal 17a to the second anode terminal 17b and from the second cathode terminal 18b to the first cathode terminal 18a, because magnetic flux is cancelled at the respective overlap portions.

Figure 9C:
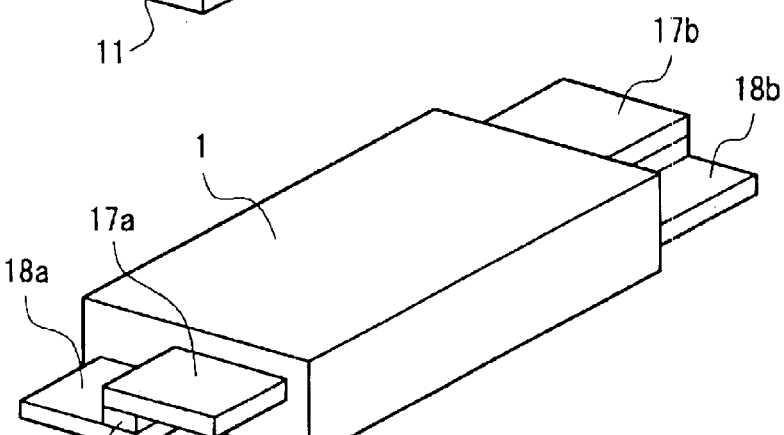
FIG. 9C is a perspective view of a capacitor for illustrating a fifth example according to Embodiment 3 of the present invention.
Figure 9D:
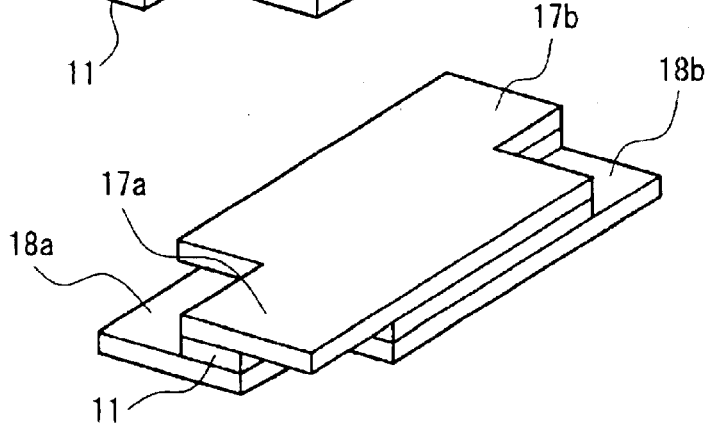
FIG. 9D is a perspective view for illustrating the shapes and the arrangement of an anode terminal and a cathode terminal of the same capacitor.

FIGS. 9C and D show a fifth example according to Embodiment 3. Like the fourth example, each set of an anode terminal and a cathode terminal is led out from one of the opposed side surfaces of a package 1. This example, however, is different from the fourth example in that a first anode terminal 17a and a second anode terminal 17b are arranged so that centers of the terminals in the width direction are not aligned in one line, more specifically, not in the T-letter form but in a step-wise form. FIG. 9D shows the shapes and the arrangement of the anode terminals and the cathode terminals. When a circuit is configured with such a capacitor, by designing so as to allow currents to flow from the first anode terminal 17a to the second anode terminal 17b and from the second cathode terminal 18b to the first cathode terminal 18a, much lower ESL can be realized than the fourth example, because current paths cross each other, which increases the degree of cancellation of the magnetic flux as compared with the fourth example.

Embodiment 4

Figure 10:
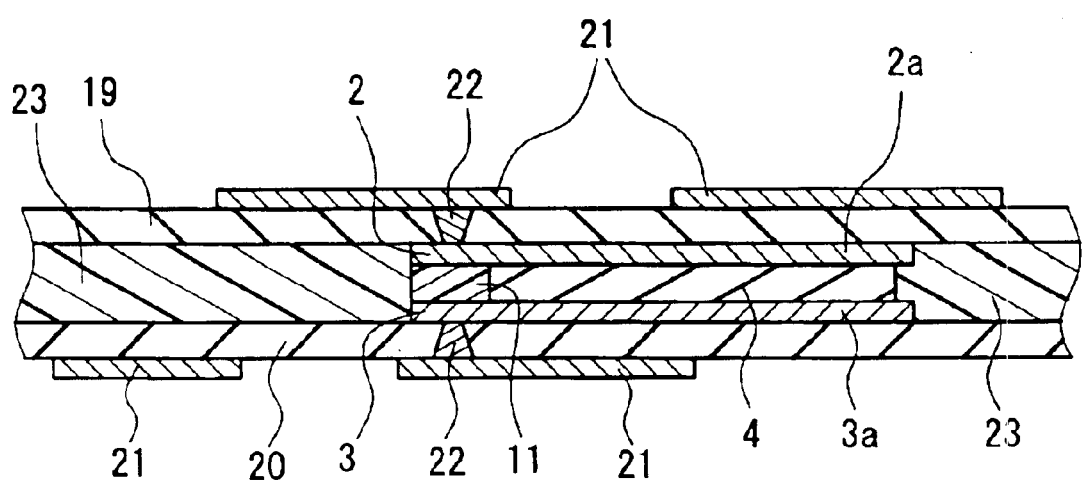
FIG. 10 is a cross-sectional view of a capacitor built-in board for illustrating a first example according to Embodiment 4 of the present invention.

FIG. 10 is a cross-sectional view of a capacitor built-in board for illustrating a first example according to Embodiment 4 of the present invention. A multilayer wiring board shown in FIG. 10 includes a first wiring circuit layer 19, a second wiring circuit layer 20 and a resin layer 23 interposed between these wiring circuit layers. Although, in FIG. 10, wiring conductors 21 are formed on one of the main surfaces of the wiring circuit layers 19 and 20, the wiring conductors 21 may be formed on both of the main surfaces of the wiring circuit layers 19 and 20.

Between the first wiring circuit layer 19 and the second wiring circuit layer 20, a capacitor is arranged where the capacitor has the same configuration as that of FIG. 1 with an exception that the package is not included. This capacitor includes a capacitor element made up of an anode 2a, a cathode 3a and a dielectric layer 4a interposed between them, and an anode terminal 2a and a cathode terminal 3a extend in the same direction from this capacitor element. An insulation layer (resin layer) 11 is interposed between these terminals. Although this embodiment shows an example of using the capacitor that does not include the package 1, a packaged capacitor also can be used.

The anode terminal 2 of the capacitor is connected with the wiring conductor 21 on the first wiring circuit layer 19 via a through hole conductor 22, and the cathode terminal 3 is connected with the wiring conductor 21 on the second wiring circuit layer 20 via a through hole conductor 22. Note here that a resin layer 11 functioning so as to insulate the anode terminal. 2 and the cathode terminal 3 from each other may be formed as a part of the resin layer 23.

In this way, the anode terminal 2 and the cathode terminal 3 are led out in the same direction from the capacitor, and therefore a distance between the terminals can be shortened as compared with a capacitor whose terminals are led out in opposite directions, thus reducing ESL correspondingly and suppressing impedance at high frequencies, whereby high frequency properties are improved.

Figure 11A:
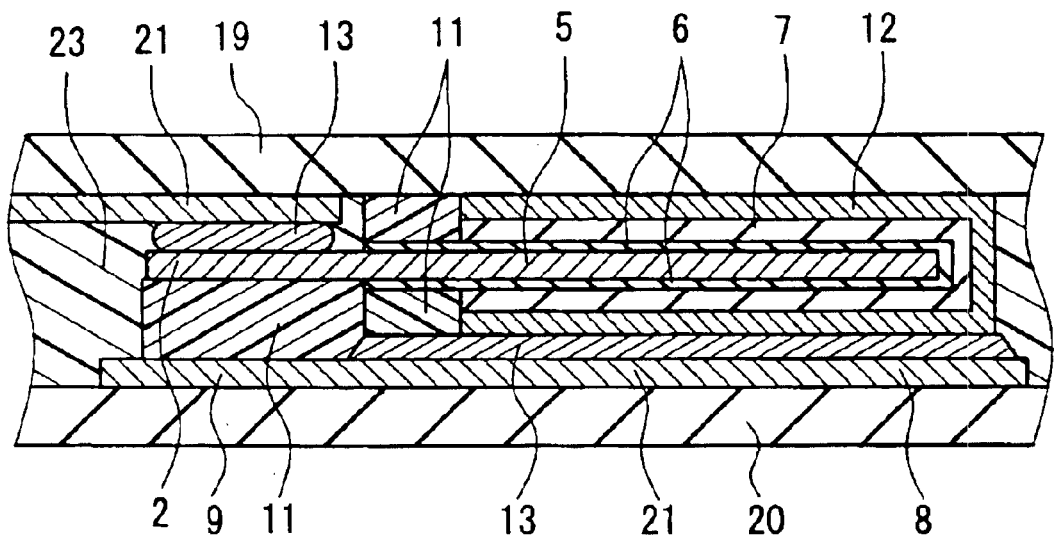
FIG. 11A is a cross-sectional view of a capacitor built-in board for illustrating a second example according to Embodiment 4 of the present invention.
Figure 11B:
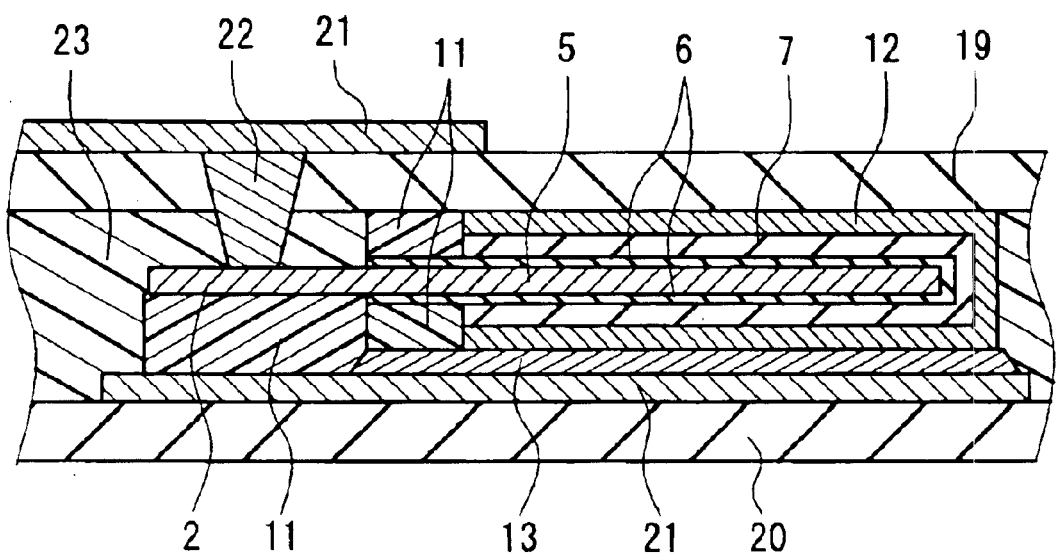
FIG. 11B is a cross-sectional view of a capacitor built-in board for illustrating a third example according to Embodiment 4 of the present invention.

FIG. 11A is a cross-sectional view of a capacitor built-in board for illustrating a second example according to Embodiment 4, and FIG. 11B is a cross-sectional view of a capacitor built-in board for illustrating a third example according to Embodiment 4.

FIG. 11A shows, as an example of capacitors used, a capacitor obtained by forming an anode oxidation film layer 6 on a predetermined surface of a valve metal thin plate 5, forming a solid electrolyte layer 7 on its surface, forming a cathode conductive layer 12 on its surface, connecting a wiring conductor 21 serving as a cathode with the cathode conductive layer 12 using a conductive adhesive 13 and disposing a resin layer 11 for insulation. As for this wiring conductor 21, a portion thereof functions as a cathode 8, and another portion thereof functions as a cathode terminal 9. The cathode terminal 9 extends in the same direction as that of an anode terminal 2. However, the capacitors used are not limited to this example.

In this capacitor built-in board, the capacitor is provided between a pair of the wiring circuit layers 19 and 20, and the anode terminal 2 and the wiring conductor 21 on the inner main surface of the first wiring circuit layer 19 are connected with each other via the conductive adhesive 13.

In this way, by configuring the capacitor built-in board with a capacitor prior to packaging, the manufacturing process can be simplified and the board can be made thinner. In this case, to configure the anode terminal 2 and the wiring conductor 21 so as to overlap each other enables low ESL.

Although the capacitor built-in board of FIG. 11B basically has the same configuration as that of FIG. 11A, an anode terminal 2 and a wiring conductor 21 on an outer main surface of a first wiring circuit layer 19 are connected with each other via a through hole conductor 22.

Note here that the examples shown in FIGS. 11A and B are not limited to this illustrated scope, and a configuration obtained by combining them also has the same effects. In addition, although these examples omit a package, a packaged capacitor also has the same effects.

Figure 12:
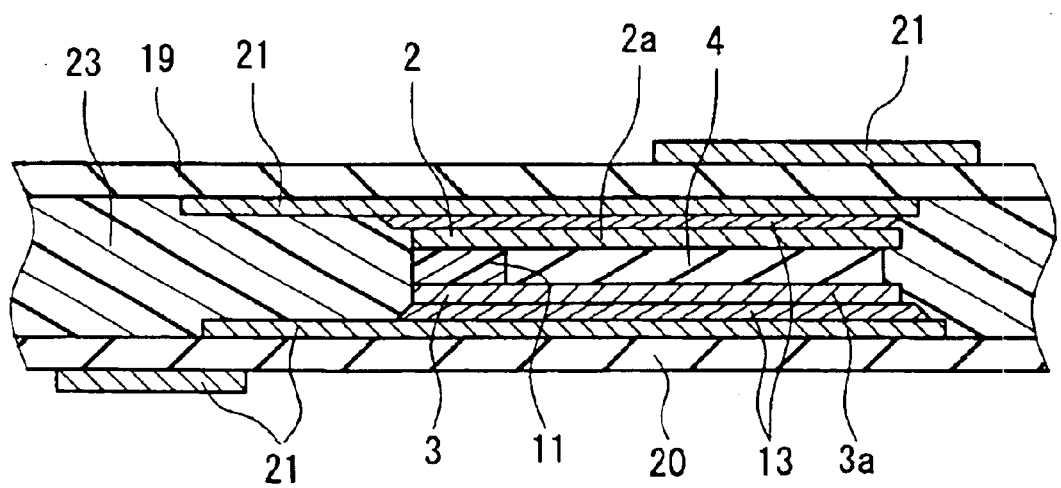
FIG. 12 is a cross-sectional view of a capacitor built-in board for illustrating a fourth example according to Embodiment 4 of the present invention.

FIG. 12A is a cross-sectional view of a capacitor built-in board for illustrating a fourth example according to Embodiment 4. In this example, an anode 2 and an anode terminal 2a of a capacitor and a cathode 3 and a cathode terminal 3a of the same respectively are bonded to wiring conductors 21 formed on opposed inner main surfaces of wiring circuit layers using a conductive adhesive 13.

In the above-described first to fourth examples according to Embodiment 4, the same effects can be obtained by using not only the same capacitor as in FIG. 1 but also a capacitor having the same configurations as in FIGS. 2 to 5.

Figure 13:
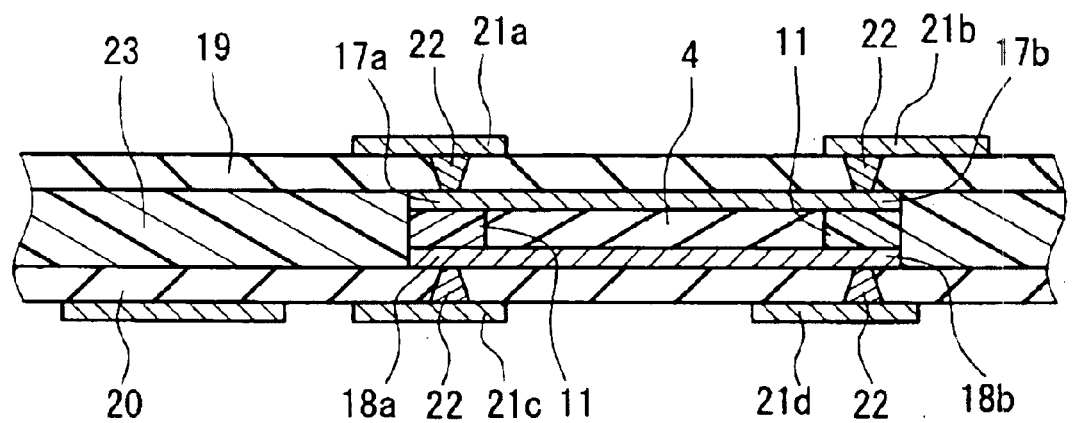
FIG. 13 is a cross-sectional view of a capacitor built-in board for illustrating a fifth example according to Embodiment 4 of the present invention.

FIG. 13 is a cross-sectional view of a capacitor built-in board for illustrating a fifth example according to Embodiment 4, which shows an example using a capacitor shown in FIG. 7, 8A or 8B, where the capacitor does not include a package. In this capacitor built-in board, a first anode terminal 17a and a second anode terminal 17b and a first cathode terminal 18a and a second cathode terminal 18b respectively are led out in opposite directions.

The first anode terminal 17a and the second anode terminal 17b respectively are connected with a first wiring conductor 21a and a third wiring conductor 21b formed on a first wiring circuit layer 19 via through hole conductors 22, whereas the first cathode terminal 18a and the second cathode terminal 18b respectively are connected with a second wiring conductor 21c and a fourth wiring conductor 21d formed on a second wiring circuit layer 20 via through hole conductors 22. With this capacitor built-in board, low ESL can be realized because a space between the anode terminals and the cathode terminals can be shortened, and low ESR can be realized because a portion of the electrodes (anode and cathode) of the capacitor is used as wirings.

Note here that although FIG. 13 shows an example of using the capacitor that does not include a package, a packaged capacitor also can realize a similar capacitor built-in board.

The above-described examples of capacitor built-in boards show only the portion corresponding to the capacitor and omit semiconductor components and other electronic components, which can be packaged by conventional methods. Additionally, capacitors are not limited to the capacitor shown in FIG. 7, and the same effects can be obtained also in the configurations using the capacitor shown in FIG. 8A or B.

Figure 17:
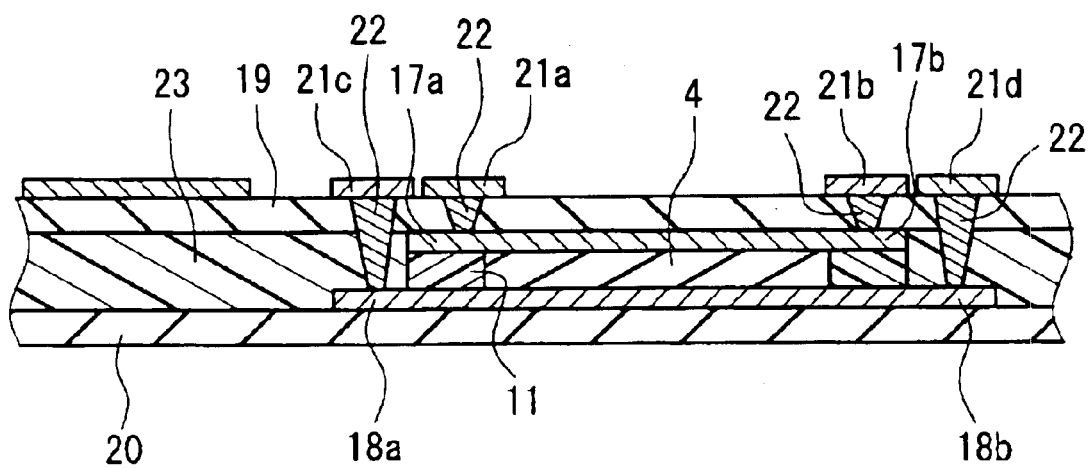
FIG. 17 is a cross-sectional view of a capacitor built-in board for illustrating a sixth example according to Embodiment 4 of the present invention.

FIG. 17 shows an example of a capacitor built-in board in which the capacitor shown in FIG. 8A or B is embedded and anode terminals 17a and 17b and cathode terminals 18a and 18b are all connected with wiring conductors 21a, 21b, 21c and 21d formed on a main surface of a first wiring circuit layer.

The following describes properties of the capacitors in the above-described Embodiments 1 to 4.

Figure 14:
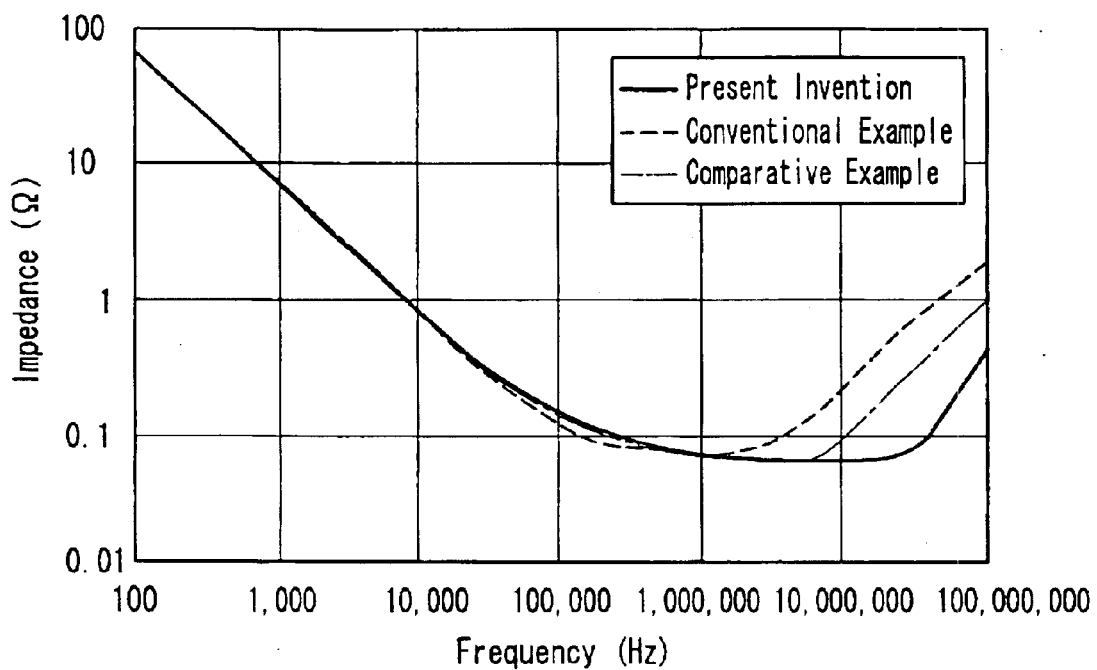
FIG. 14 shows relationships between impedance and frequency of the capacitors according to the present invention, the conventional example and a comparative example.
Figure 16A:
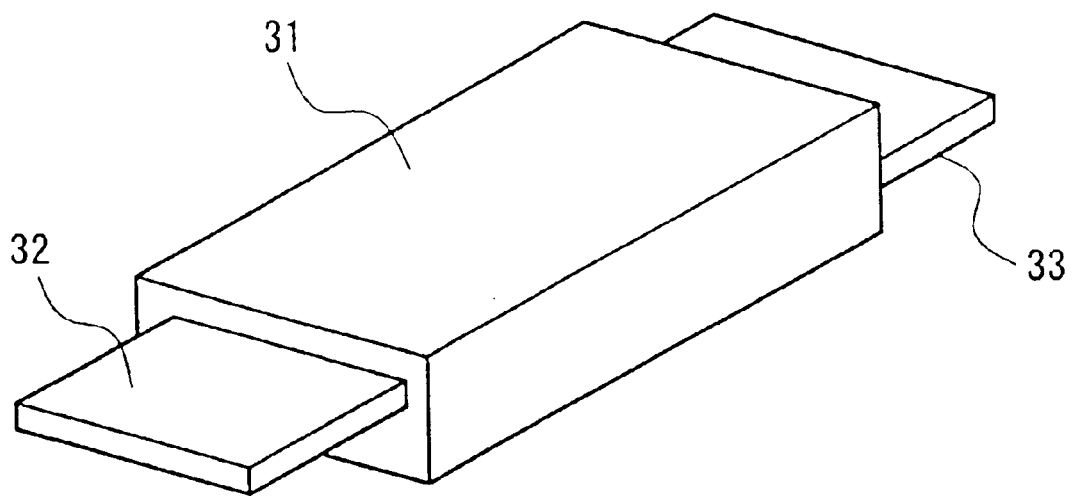
FIG. 16A is a perspective view of the conventional capacitor.
Figure 16B:
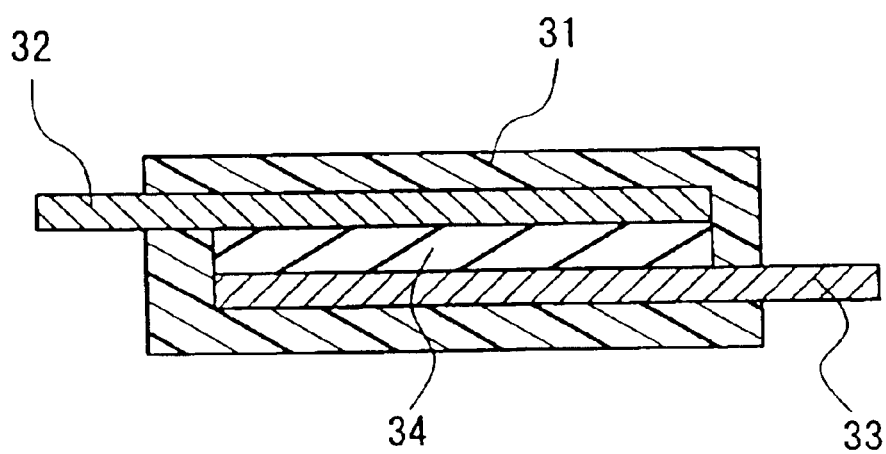
FIG. 16B is a cross-sectional view of the same capacitor.

FIG. 14 shows one example of a relationship between the impedance and frequencies of the capacitor shown in FIG. 1. As indicated by the solid line of FIG. 14, while the impedance of this capacitor decreases with increases in frequency and then increases again from a point determined by the shape and the dimensions, low impedance could be maintained up to several tens MHz of high frequencies. In contrast to this, in the capacitor shown in FIG. 1 whose terminals were led out in opposite directions (corresponding to FIG. 16), as indicated by the dashed line of FIG. 14 (conventional example), the impedance thereof increased rapidly at frequencies more than 1 MHz.

Figure 15:
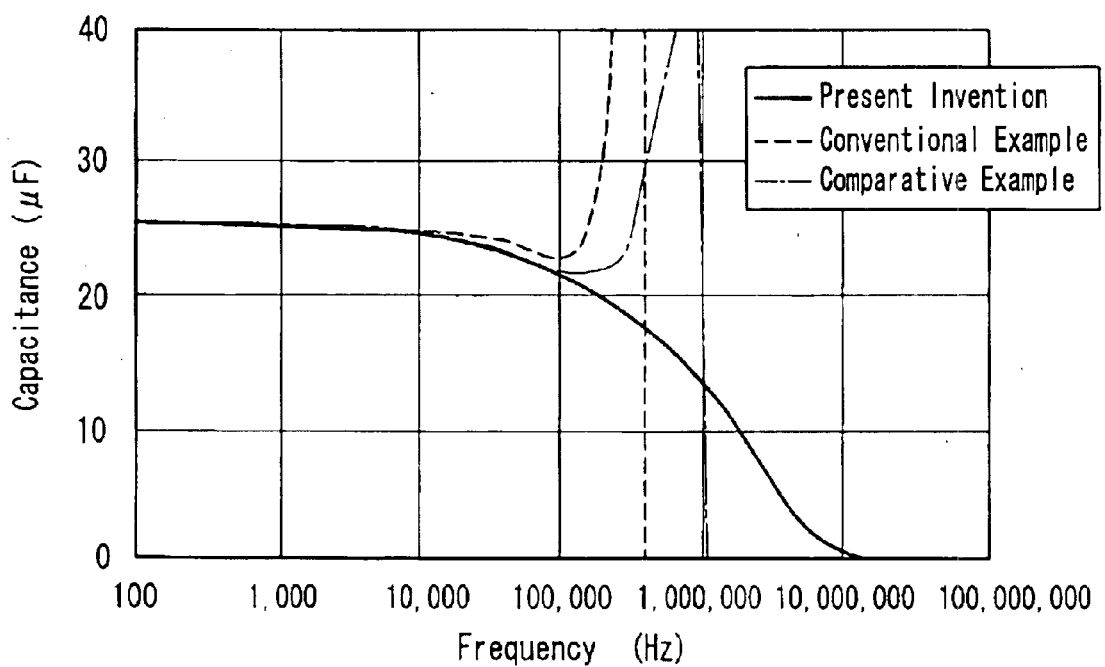
FIG. 15 shows relationships between capacitance and frequency of the capacitors according to the present invention, the conventional example and the comparative example.

FIG. 15 shows one example of a relationship between the capacitance and frequencies of the capacitor shown in FIG. 1. As indicated by the solid line of FIG. 15, the capacitance of this capacitor gradually decreases with increases in frequencies, and by virtue of low ESL, the capacitance could be measured up to 10 MHz of high frequencies without the occurrence of resonance. However, when the terminals of the capacitor shown in FIG. 1 were led out in opposite directions (corresponding to FIG. 16), as indicated by the dashed line of FIG. 15 (conventional example), resonance occurred at frequencies exceeding 100 kHz because of large ESL, so that the capacitance could not be measured.

Figure 18:
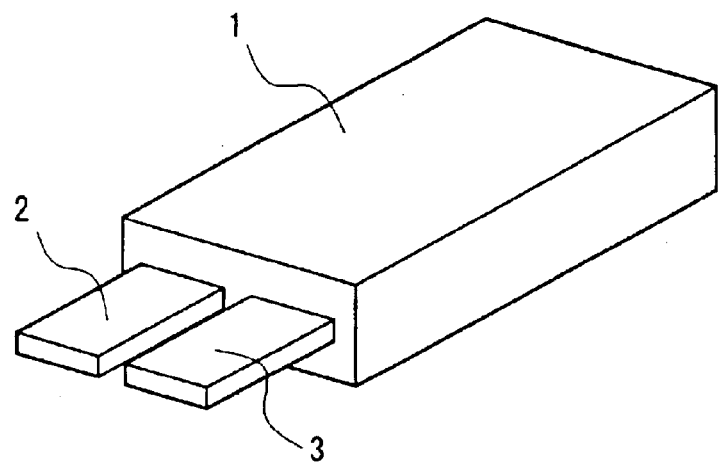
FIG. 18 is a perspective view illustrating the capacitor according to the comparative example.

Further, as shown in FIG. 18, a capacitor having the same configuration as above was manufactured with an exception that an anode terminal 2 and a cathode terminal 3 were led out from a package 1 in the same direction so as not to overlap each other in the direction perpendicular to their terminal planes. As for this capacitor also, a relationship between the impedance or the capacitance and frequencies were measured. The results are indicated by the alternate long and short dashed lines of FIGS. 14 and 15 (comparative example). By leading out the terminals in the same direction, the capacitor in the comparative example could realize lower impedance and the capacitance at higher frequencies as compared with the capacitor in the conventional example. However, the effects of the capacitor in the comparative example are not sufficient because their terminals do not overlap each other in the direction perpendicular to the terminal planes.

Figure 19A:
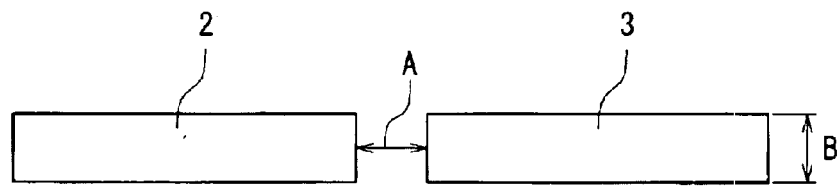
FIG. 19A is a cross-sectional view for illustrating the terminal arrangement of the capacitor according to the comparative example.
Figure 19B:
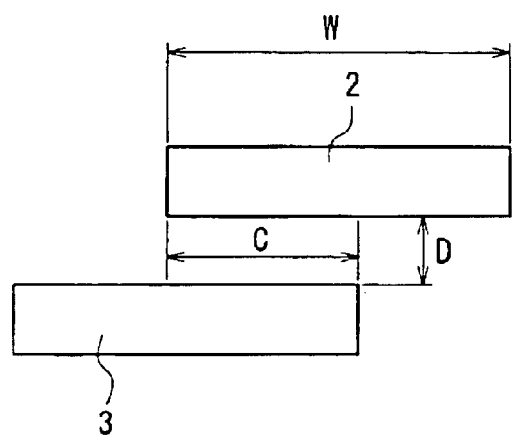
FIG. 19B is a cross-sectional view for illustrating the terminal arrangement of the capacitor according to the present invention.

FIGS. 19A and B are diagrams for schematically explaining the terminal arrangement. FIG. 19A shows the capacitor in the comparative example and FIG. 19B shows the capacitor of the present invention (e.g., the capacitor of FIG. 5C). Here, the following describes the case assuming that distances A and D between terminals are the same (e.g., 100 μm) and the thickness B of the terminals also is the same as the distance between the terminals (e.g., 100 μm as above).

Figure 20A:
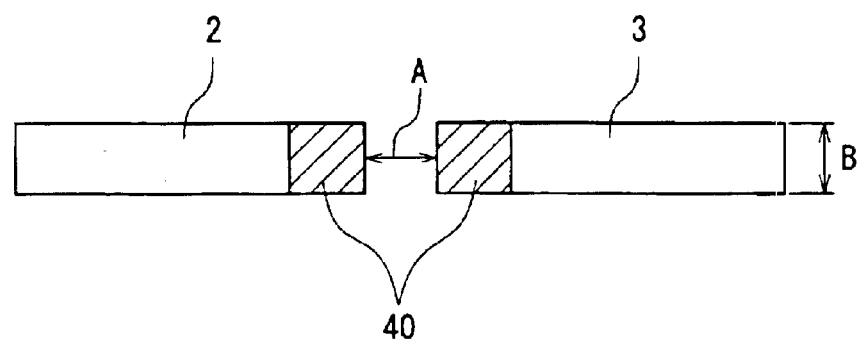
FIG. 20A is a cross-sectional view for illustrating a relationship between the terminal arrangement and ESL of the capacitor according to the comparative example.

As shown in FIGS. 20A and B, when a planar terminal is considered as an aggregate of lead wires 40 whose cross-sections constitute a parallelepiped, in the terminal arrangement of the comparative example, lead wires 40 in the anode terminal and the cathode terminal, each of which corresponds to one parallelepiped unit, are arranged at an interval of 100 μm as the distance between the terminals. Whereas, in the terminal arrangement of the present invention, lead wires 40 in which three parallelepiped units are connected are arranged at an interval of 100 μm as the distance between the terminals. If the inductance per one parallelepiped unit is defined as the unit inductance, then the inductance to which the terminal portion of the present invention shown in FIG. 20B contributes is in proportion to the reciprocal of the sum of the reciprocals of the unit inductances. Therefore, the capacitor of FIG. 20B having a larger ratio in the terminals occupied by the unit inductances whose anode terminal and cathode terminal are close to each other has low ESL, whereby lower impedance and capacitance at higher frequencies can be obtained as compared with the capacitor of FIG. 20A.

By the configuration in which an anode terminal and a cathode terminal overlap each other in the direction perpendicular to the terminal planes, if the width of the capacitor from which terminals are led out is fixed, the width of the terminals can be made larger. For instance, with respect to a chip capacitor with a fixed chip width, twice or more width can be secured for the width of the leading terminals. For that reason, a terminal with lower resistance and lower ESL can be realized.

Figure 20B:
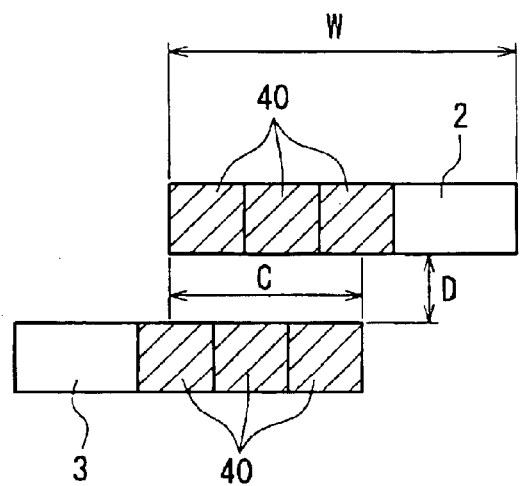
FIG. 20B is a cross-sectional view for illustrating a relationship between the terminal arrangement and ESL of the capacitor according to the present invention.

In order to have greater effects than the capacitor in the comparative example (FIG. 20A), at least, the length for the terminals to overlap each other (overlapping width C: FIG. 20B) in the in-plane direction of the terminal, which is perpendicular to the terminal leading-out direction, should be longer than the thickness of the anode terminal and the cathode terminal (a smaller one in the case where the anode terminal and the cathode terminal have different thicknesses). Since terminals of 20 $\mu$m or more in thickness normally are used, the overlapping width C should be normally at 20 $\mu$m or more, and a width of 0.2 mm or more is preferable.

Although a shorter distance between the terminals in the direction perpendicular to the terminal planes (distance D between terminals: FIG. 20B) leads to lower ESL, a too short distance might cause electrical shorting between them. Preferably, the distance D between terminals is 5 to 500 $\mu$m, and particularly 5 to 200 $\mu$m is preferable. Preferably, the terminal width W is 0.5 mm or more.

As described above, in the capacitor of the present invention, the anode terminal and the cathode terminal are led out in the same direction from one side of the capacitor, and the terminals have a planar configuration. Compared with a capacitor whose electrode terminals are led out in opposite directions, a distance between the electrode terminals is shortened, and their terminal planes partially overlap each other, whereby ESL can be reduced at high frequencies. In addition, although the capacity of the capacitor decreases at high frequencies, sufficient values for operation can be maintained.

Furthermore, the capacitor built-in board of the present invention enables the circuit configuration with low ESL and low ESR.

What is claimed is:

1. A capacitor comprising:
   a capacitor element comprising a dielectric layer, and an anode and a cathode that are arranged to support the dielectric layer therebetween;
   a planar anode terminal formed by prolonging the anode or connected with the anode; and
   a planar cathode terminal formed by prolonging the cathode or connected with the cathode,
   wherein the anode terminal and the cathode terminal are led out from the capacitor element in a same direction so as to be in parallel with each other, and
   at least a part of the anode terminal and at least a part of the cathode terminal overlap each other without contact in a direction perpendicular to a terminal plane of at least one terminal selected from the anode terminal and the cathode terminal,
   wherein a wiring conductor on a circuit board is used as at least one selected from the anode, the anode terminal, the cathode and the cathode terminal.

2. The capacitor according to claim 1, further comprising an insulation layer arranged between the anode terminal and the cathode terminal.

3. The capacitor according to claim 1, wherein the capacitor element further comprises a solid electrolyte layer between the dielectric layer and the cathode.

4. The capacitor according to claim 3, wherein the capacitor element further comprises a carbon layer and a silver conductive resin layer between the solid electrolyte layer and the cathode.

5. A capacitor comprising:
   a capacitor element comprising a dielectric layer, and an anode and a cathode that are arranged to support the dielectric layer therebetween;
   a planar anode terminal formed by prolonging the anode or connected with the anode;
   a planar cathode terminal formed by prolonging the cathode or connected with the cathode;
   a planar second anode terminal formed by extending the anode or connected with the anode; and
   a planar second cathode terminal formed by extending the cathode or connected with the cathode,
   wherein the anode terminal and the cathode terminal are led out from the capacitor element in a same direction so as to be in parallel with each other,
   at least a part of the anode terminal and at least a part of the cathode terminal overlap each other without contact in a direction perpendicular to a terminal plane of at least one terminal selected from the anode terminal and the cathode terminal,
   the second anode terminal and the second cathode terminal are led out from the capacitor element in a same direction so as to be in parallel with each other,
   at least a part of the second anode terminal and at least a part of the second cathode terminal overlap each other without contact in a direction perpendicular to a terminal plane of at least one terminal selected from the second anode terminal and the second cathode terminal, and a wiring conductor on a circuit board is used as at least one selected from the anode, the first anode terminal, the second anode terminal, the cathode, the first cathode terminal and the second cathode terminal.

6. A capacitor built-in board comprising a first wiring circuit layer, a second wiring circuit layer, a resin layer and a capacitor comprising:
   a capacitor element comprising a dielectric layer, and an anode and a cathode that are arranged to support the dielectric layer therebetween;
   a planar anode terminal formed by prolonging the anode or connected with the anode; and
   a planar cathode terminal formed by prolonging the cathode or connected with the cathode,
   wherein the anode terminal and the cathode terminal are led out from the capacitor element in a same direction so as to be in parallel with each other,
   at least a part of the anode terminal and at least a part of the cathode terminal overlap each other without contact in a direction perpendicular to a terminal plane of at least one terminal selected from the anode terminal and the cathode terminal,
   the resin layer and the capacitor are arranged between the first wiring circuit layer and the second wiring circuit layer, and
   the anode terminal of the capacitor is connected electrically with a first wiring conductor formed on a main surface of one selected from the first wiring circuit layer and the second wiring circuit layer, and the cathode terminal of the capacitor is connected electrically with a second wiring conductor formed on a main surface of one selected from the first wiring circuit layer and the second wiring circuit layer.

7. The capacitor built-in board according to claim 6, wherein the first wiring conductor is formed on a main surface of the first wiring circuit layer, and the second wiring conductor is formed on a main surface of the second wiring circuit layer.

8. The capacitor built-in board according to claim 6, wherein an end portion of one terminal selected from the anode terminal and the cathode terminal protrudes beyond an end portion of the other terminal in at least one direction selected from a terminal leading-out direction as the same direction and an in-plane direction of a terminal plane perpendicular to the terminal leading-out direction, and the first wiring conductor and the second wiring conductor are formed on a main surface of the same wiring circuit layer.

9. The capacitor built-in board according to claim 6, wherein the capacitor further comprises:

a planar second anode terminal formed by extending the anode or connected with the anode; and a planar second cathode terminal formed by extending the cathode or connected with the cathode, wherein the second anode terminal and the second cathode terminal are led out from the capacitor element in a same direction so as to be in parallel with each other, and at least a part of the second anode terminal and at least a part of the second cathode terminal overlap each other without contact in a direction perpendicular to a terminal plane of at least one terminal selected from the second anode terminal and the second cathode terminal, the second anode terminal and the second cathode terminal are connected electrically with a third wiring conductor and a fourth wiring conductor, respectively, the first wiring conductor and the third wiring conductor are formed on a main surface of the first wiring circuit layer, and the second wiring conductor and the fourth wiring conductor are formed on a main surface of the second wiring circuit layer.

10. The capacitor built-in board according to claim 6, wherein the capacitor further comprises:

a planar second anode terminal formed by extending the anode or connected with the anode; and a planar second cathode terminal formed by extending the cathode or connected with the cathode, wherein the second anode terminal and the second cathode terminal are led out from the capacitor element in a same direction so as to be in parallel with each other, at least a part of the second anode terminal and at least a part of the second cathode terminal overlap each other without contact in a direction perpendicular to a terminal plane of at least one terminal selected from the second anode terminal and the second cathode terminal, an end portion of one terminal selected from the anode terminal and the cathode terminal protrudes beyond an end portion of the other terminal in at least one direction selected from a terminal leading-out direction and an in-plane direction of a terminal plane perpendicular to the terminal leading-out direction, an end portion of one terminal selected from the second anode terminal and the second cathode terminal protrudes beyond an end portion of the other terminal in at least one direction selected from a second terminal's leading-out direction and an in-plane direction of a terminal plane perpendicular to the second terminal's leading-out direction, the second anode terminal and the second cathode terminal are connected electrically with a third wiring conductor and a fourth wiring conductor, respectively, and the first wiring conductor, the second wiring conductor, the third wiring conductor and the fourth wiring conductor are formed on a main surface of the same wiring circuit layer.

11. The capacitor built-in board according to claim 6, wherein at least one selected from the anode, the cathode, the anode terminal and the cathode terminal constitutes at least a part of a wiring conductor formed on a main surface of one selected from the first wiring circuit layer and the second wiring circuit layer.

12. The capacitor built-in board according to claim 11, wherein at least one selected from the anode and the anode terminal constitutes at least a part of a wiring conductor formed on a main surface the first wiring circuit layer, and at least one selected from the cathode and the cathode terminal constitutes at least a part of a wiring conductor formed on a main surface the second wiring circuit layer.

* * * * *

UNITED STATES PATENT AND TRADEMARK OFFICE
CERTIFICATE OF CORRECTION

PATENT NO.   : 6,836,401 B2
DATED        : December 28, 2004
INVENTOR(S)  : Yoshida et al.

It is certified that error appears in the above-identified patent and that said Letters Patent is hereby corrected as shown below:

<u>Column 6,</u>
Line 34, "close to each other, thus reducing ESL correspondingly" should read
-- close to each other, thus reducing ESL correspondingly. --.

<u>Column 11,</u>
Line 34, "These letter form electrodes," should read -- These T-letter form electrodes --.
Line 35, "central vertical portions in the T letter" should read -- central vertical portions in the T-letter --.

Signed and Sealed this

Twenty-seventh Day of December, 2005

JON W. DUDAS
*Director of the United States Patent and Trademark Office*